United States Patent
Kim et al.

(10) Patent No.: US 7,653,846 B2
(45) Date of Patent: Jan. 26, 2010

(54) MEMORY CELL BIT VALVE LOSS DETECTION AND RESTORATION

(75) Inventors: Nam Sung Kim, Portland, OR (US); Muhammad Kheliah, Tigard, OR (US); Yibin Ye, Portland, OR (US); Dinesh Somasekhar, Portland, OR (US); Vivek De, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 163 days.

(21) Appl. No.: 11/648,490

(22) Filed: Dec. 28, 2006

(65) Prior Publication Data

US 2008/0162986 A1 Jul. 3, 2008

(51) Int. Cl.
*G11C 29/00* (2006.01)
(52) U.S. Cl. ....................................................... 714/718
(58) Field of Classification Search .................... 714/718
See application file for complete search history.

(56) References Cited

U.S. PATENT DOCUMENTS

| | | | |
|---|---|---|---|
| 4,654,853 A * | 3/1987 | Moriyama et al. .......... 714/774 |
| 4,953,127 A | 8/1990 | Nagahashi et al. |
| 5,047,979 A | 9/1991 | Leung |
| 5,485,592 A | 1/1996 | Lau |
| 5,627,993 A | 5/1997 | Abato et al. |
| 5,724,292 A | 3/1998 | Wada |
| 5,737,748 A | 4/1998 | Shigeeda |
| 5,850,359 A | 12/1998 | Liu |
| 5,900,016 A | 5/1999 | Ghosh |
| 6,009,548 A * | 12/1999 | Chen et al. ................... 714/762 |
| 6,145,058 A | 11/2000 | Suganuma |
| 6,178,537 B1 * | 1/2001 | Roohparvar ................. 714/773 |
| 6,307,776 B1 * | 10/2001 | So et al. ................. 365/185.03 |
| 6,339,813 B1 | 1/2002 | Smith, III et al. |
| 6,442,060 B1 | 8/2002 | Leung et al. |
| 6,552,923 B2 | 4/2003 | Houston |
| 6,567,329 B2 | 5/2003 | Somasekhar et al. |
| 6,735,733 B2 * | 5/2004 | La Rosa ...................... 714/765 |
| 6,757,784 B2 | 6/2004 | Lu et al. |
| 6,831,871 B2 | 12/2004 | Khellah et al. |
| 6,859,864 B2 | 2/2005 | Khare et al. |
| 6,990,623 B2 * | 1/2006 | Furukawa .................... 714/773 |
| 7,020,751 B2 | 3/2006 | Kershaw |
| 7,403,426 B2 | 7/2008 | Hamzaoglu et al. |
| 2002/0035710 A1 * | 3/2002 | Miura et al. ................. 714/716 |

(Continued)

OTHER PUBLICATIONS

Aug. 7, 2006 Office Action for U.S. Appl. No. 11/172,078 (published as U.S. Patent Application Publication No. US 2007/0002607 A1), 9 pages.

(Continued)

*Primary Examiner*—James C Kerveros
(74) *Attorney, Agent, or Firm*—Matthew C. Fagan (57) ABSTRACT

For one embodiment, an apparatus may include a memory cell to store a bit value, wherein the memory cell may lose the bit value in response to a memory access operation. The apparatus may also include first circuitry to detect whether the memory cell loses the bit value in response to the memory access operation and second circuitry to restore the bit value in the memory cell in response to detection that the memory cell loses the bit value. Other embodiments include other apparatuses, methods, and systems.

20 Claims, 8 Drawing Sheets

U.S. PATENT DOCUMENTS

| | | | |
|---|---|---|---|
| 2002/0174397 A1* | 11/2002 | Furukawa | 714/764 |
| 2002/0199152 A1 | 12/2002 | Garney et al. | |
| 2003/0058681 A1 | 3/2003 | Coulson | |
| 2003/0126373 A1 | 7/2003 | David | |
| 2003/0218925 A1 | 11/2003 | Torjussen et al. | |
| 2005/0111194 A1 | 5/2005 | Sohn | |
| 2005/0114588 A1 | 5/2005 | Lucker et al. | |
| 2006/0268626 A1 | 11/2006 | Hamzaoglu et al. | |
| 2006/0277367 A1 | 12/2006 | Faber | |
| 2007/0002607 A1 | 1/2007 | Khellah et al. | |
| 2007/0130496 A1* | 6/2007 | Kanno | 714/763 |
| 2009/0083495 A1 | 3/2009 | Khellah et al. | |

OTHER PUBLICATIONS

Bhavnagarwala, Azeez J., et al., "Dynamic-Threshold CMOS SRAM Cells for Fast, Portable Applications", Proceedings of the 13th Annual IEEE International ASIC/SOC Conference, Sep. 13-16, 2000, pp. 359-363.

Bhavnagarwala, Azeez J., et al., "The Impact of Intrinsic Device Fluctuations on CMOS SRAM Cell Stability", IEEE Journal of Solid-State Circuits, vol. 36, No. 4, Apr. 2001, pp. 658-665.

Kawaguchi, Hiroshi, et al., "A 0.5V, 400MHz, VDD-Hopping Processor with Zero-VTH FD-SOI Technology", IEEE International Solid-State Circuits Conference, Feb. 10, 2003, 10 pages.

Khellah, Muhammad, et al., "A 4.2GHz 0.3mm2 256kb Dual-Vcc SRAM Building Block in 65nm CMOS", IEEE International Solid-State Circuits Conference, Feb. 8, 2006, 10 pages.

Pilo, Harold, et al., "An SRAM Design in 65nm and 45nm Technology Nodes Featuring Read and Write-Assist Circuits to Expand Operating Voltage", Symposium on VLSI Circuits, Digest of Technical Papers, Jun. 15-17, 2006, pp. 15-16.

Yamaoka, Masanao, et al., "0.4-V Logic-Library-Friendly SRAM Array Using Rectangular-Diffusion Cell and Delta-Boosted-Array Voltage Scheme", IEEE Journal of Solid-State Circuits, vol. 39, No. 6, Jun. 2004, pp. 934-940.

* cited by examiner

MEMORY CELL BIT VALVE LOSS DETECTION AND RESTORATION

RELATED APPLICATION(S)

This patent application discloses technology related to that disclosed in U.S. patent application Ser. No. 11/172,078, filed Jun. 29, 2005, entitled MEMORY CIRCUIT, by Muhammad M. Khellah, Dinesh Somasekhar, Yibin Ye, and Vivek K. De, now abandoned.

FIELD

Embodiments described herein generally relate to memory.

BACKGROUND

Figure 1:
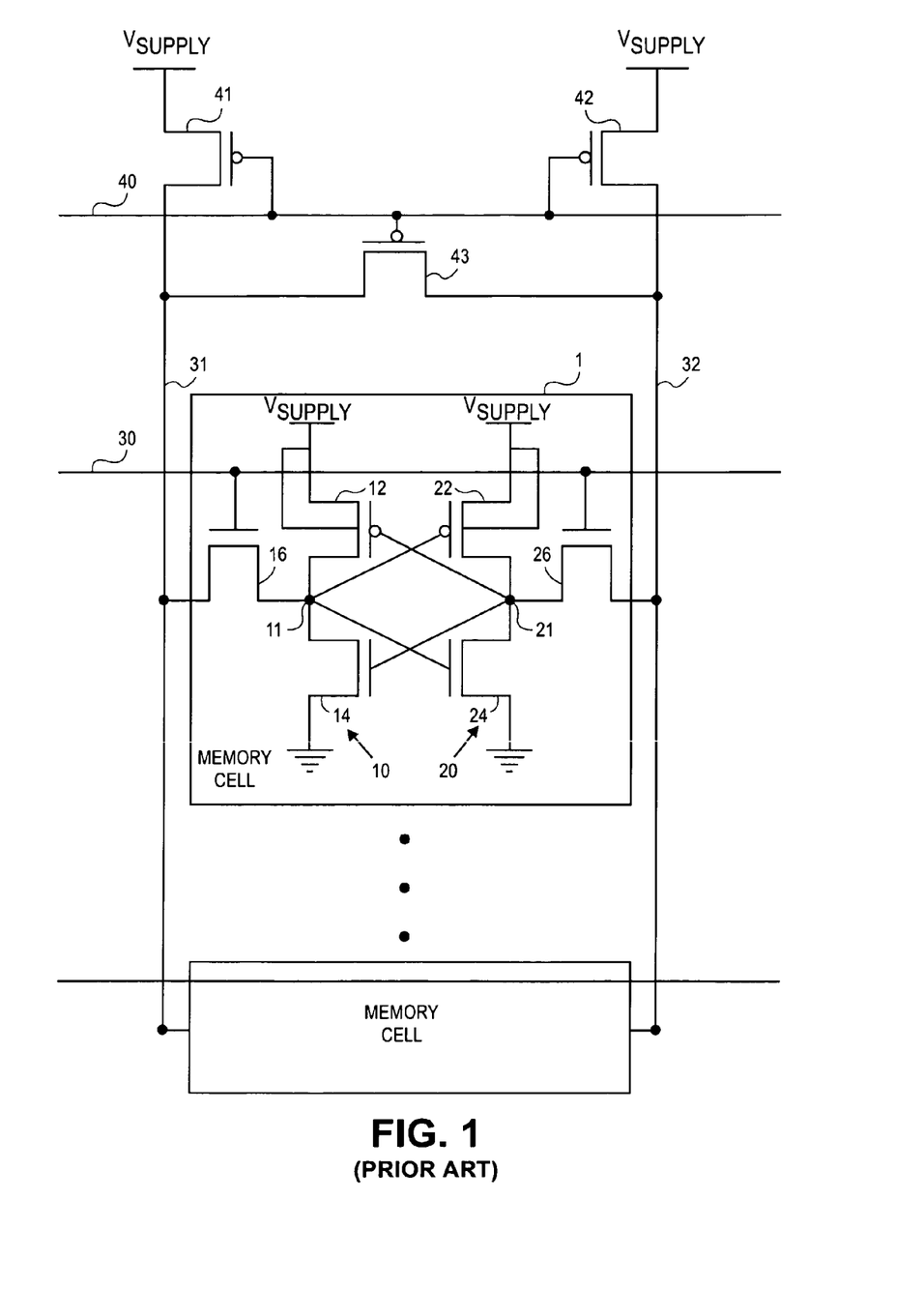
FIG. 1 illustrates circuitry for a prior art six transistor (6T) memory cell for a static random access memory (SRAM)

FIG. 1 illustrates circuitry for a prior art six transistor (6T) memory cell 1 for a static random access memory (SRAM). As illustrated in FIG. 1, memory cell 1 has two cross-coupled inverters 10 and 20 coupled between a supply voltage $V_{SUPPLY}$ node and a ground node to generate complementary signals at storage nodes 11 and 21. Inverter 10 has a pull-up p-channel field effect transistor (PFET) 12 and a pull-down n-channel FET (NFET) 14. The gates of PFET 12 and NFET 14 are both coupled to receive a signal at storage node 21 to generate an inverted signal at storage node 11. Similarly, inverter 20 has a pull-up PFET 22 and a pull-down NFET 24. The gates of PFET 22 and NFET 24 are both coupled to receive a signal at storage node 11 to generate an inverted signal at storage node 21. The complementary signals at storage nodes 11 and 21 represent a single bit value depending on which signal is at which storage node 11 or 21.

Memory cell 1 also has NFETs 16 and 26 to access memory cell 1 to read a bit value from and/or write a bit value to memory cell 1. The gate of NFET 16 is coupled to receive a signal on a word line 30 to couple storage node 11 to a bit line 31. The gate of NFET 26 is coupled to receive a signal on word line 30 to couple storage node 21 to a bit line 32. Memory cell 1 may then be accessed by sensing the complementary signals on bit lines 31 and 32 to read the bit value stored by memory cell 1 or by asserting complementary signals on bit lines 31 and 32 to write a bit value to memory cell 1. NFETs 16 and 26 are known as transfer, access, or pass transistors.

To speed reading the bit value, PFETs 41, 42, and 43 are activated in response to a signal on a precharge line 40 to precharge bit lines 31 and 32 by coupling them to a supply voltage $V_{SUPPLY}$ node. The bit value may then be read as soon as bit line 31 is pulled down by NFET pair 14 and 16 or bit line 32 is pulled down by NFET pair 24 and 26 without having to wait for the other bit line 32 or 31 to be pulled up.

Memory cell 1 may be designed to help meet a desired level of stability for a given memory size and process to help improve manufacturing yield. Memory cell 1 may be designed, for example, to account for mismatch in threshold voltage Vth of neighboring transistors as such mismatch reduces stability. As transistor dimensions are scaled, accounting for threshold voltage mismatch can prove challenging as the variability in the number and location of channel dopant atoms can result in restrictive electrical deviations in transistor threshold voltages Vth.

Read stability can be loosely defined as the probability that memory cell 1 will retain its stored bit value during a read operation. Memory cell 1 is more susceptible to noise during a read operation because the voltage at the low storage node, such as storage node 21 for example, will rise due to the voltage division by neighboring NFETs 24 and 26 between precharged bit line 32 and the ground node when NFET 26 is activated. Read stability is therefore generally proportional to the ratio of the transconductance of NFET 24 relative to that of NFET 26.

Write stability can be loosely defined as the probability that memory cell 1 will be written with an intended bit value during a write operation. Because a write is performed by discharging the voltage at the high storage node, such as storage node 21 for example, through NFET 26, write stability is generally proportional to the ratio of the transconductance of NFET 26 relative to that of PFET 22.

Example ways to improve stability of memory cell 1 include (1) sizing pull-down NFET 14 and 24 to have an increased width at the expense of increased cell area and reduced write stability, (2) sizing access NFET 16 and 26 to have a larger channel length at the expense of reduced read current and therefore reduced read operation speed, (3) using a separate, increased supply voltage $V_{SUPPLY}$ at the expense of additional circuitry and increased power consumption and/or heat, and/or (4) adding a scalable negative supply voltage generator at the expense of additional circuitry to drive the source of pull-down NFET 14 and 24 to a negative voltage before word line 30 is activated to increase the strength of pull-down NFET 14 and 24.

BRIEF DESCRIPTION OF THE DRAWINGS

Embodiments are illustrated by way of example and not limitation in the figures of the accompanying drawings, in which like references indicate similar elements and in which.

The figures of the drawings are not necessarily drawn to scale.

DETAILED DESCRIPTION

The following detailed description sets forth example embodiments of apparatuses, methods, and systems relating to memory cell bit value loss detection and restoration. Features, such as structure(s), function(s), and/or characteristic(s) for example, are described with reference to one embodiment as a matter of convenience; various embodiments may be implemented with any suitable one or more described features.

Figure 2:
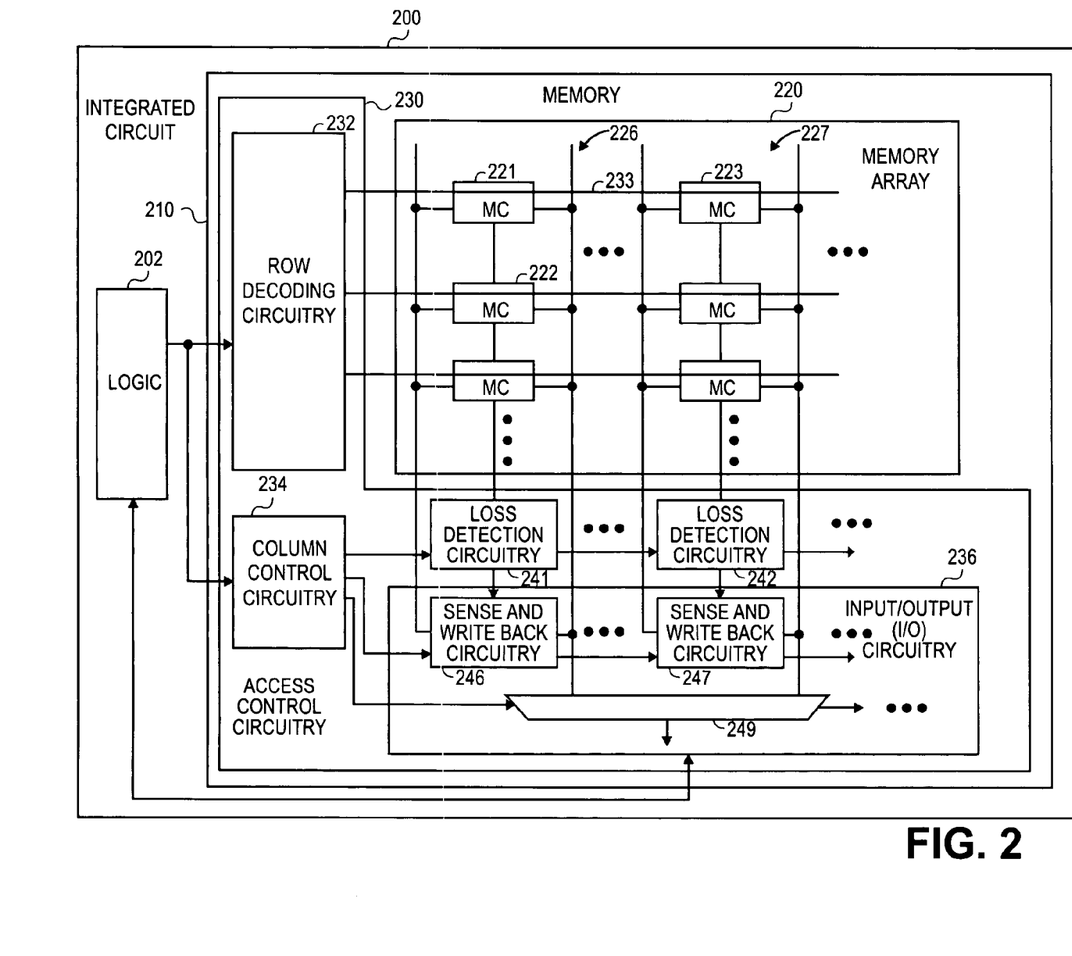
FIG. 2 illustrates, for one embodiment, a block diagram of an integrated circuit having circuitry to detect whether a memory cell loses a bit value in response to a memory access operation and to restore a bit value in the memory cell.

FIG. 2 illustrates, for one embodiment, an integrated circuit 200 having circuitry to detect whether a memory cell loses a bit value in response to a memory access operation and to restore a bit value in the memory cell.

Integrated circuit 200 for one embodiment, as illustrated in FIG. 2, may include memory 210 that includes a memory array 220 and access control circuitry 230. Memory array 220 may have a plurality of memory cells, such as memory cells (MC) 221, 222, and 223 for example. One or more memory cells may store a bit value. Access control circuitry 230 may be coupled to access memory cells in memory array 220.

One or more memory cells may lose a bit value in response to a memory access operation. Access control circuitry 230 for one embodiment may include circuitry, such as loss detection circuitry 241 and 242 for example, to detect whether one or more memory cells lose a bit value in response to a memory access operation. Access control circuitry 230 for one embodiment may also include circuitry, such as sense and write back circuitry 246 and 247 for example, to restore a bit value in a memory cell in response to detection that the memory cell loses the bit value.

Circuitry to detect loss of and restore a bit value in a memory cell for one embodiment may be used to account for cell instability. That is, memory array 220 may be accessed and a memory cell that loses a bit value in response to the access may have the bit value restored. Memory array 220 for one embodiment may then be implemented with relatively reduced concern for cell stability. Memory array 220 for one embodiment may therefore be designed with relatively denser memory cells, with relatively less circuitry, and/or with relatively less power consumption.

Circuitry to detect loss of and restore a bit value in a memory cell for one embodiment may also be used to help reduce or avoid unnecessary write operations to restore a bit value in a memory cell when that memory cell did not lose the bit value. Instead of performing a write operation for every memory cell that might only potentially lose a bit value, a write operation may be performed for one or more memory cells detected to have actually lost a bit value. Avoiding unnecessarily restoring a bit value in one or more memory cells detected to have not lost a bit value for one embodiment may help reduce power consumption.

Circuitry to detect loss of and restore a bit value in a memory cell for one embodiment may also be used for one or more memory cells that are not a target of a memory access operation. Such circuitry for one embodiment may be used to account for one or more memory cells that may lose a bit value in response to a memory access operation even though such memory cell(s), for example, are not to have their bit value(s) included in any read data for the memory access operation and/or are not to be written with a bit value included in any write data for the memory access operation.

Memory Array

Memory array 220 may include any suitable circuitry to implement any suitable memory cells to store data in any suitable manner. One or more memory cells of memory array 220 for one embodiment may include any suitable circuitry to store one or more signals representative of a bit value. One or more memory cells of memory array 220 for one embodiment may include any suitable circuitry to store complementary signals representative of a bit value. One or more memory cells of memory array 220 for one embodiment may include any suitable circuitry to implement any suitable static random access memory (SRAM) cell, such as any suitable six transistor (6T) SRAM cell for example. One or more memory cells for one embodiment may include any suitable circuitry to implement any suitable destructive read memory cell, such as a destructive read static random access memory (DR-SRAM) cell for example. One or more memory cells of memory array 220 for one embodiment may include circuitry for a 6T SRAM cell similar to that shown in FIG. 1 and may be designed with relatively reduced concern for cell stability. One or more memory cells for one embodiment may be designed with a unity beta ratio where devices are substantially equally sized with relatively less or minimal geometry.

Memory array 220 may include any suitable circuitry to implement any suitable memory cells arranged in any suitable manner. Memory array 220 for one embodiment may include any suitable circuitry for an array of any suitable number of memory cells logically arranged in any suitable number of rows and any suitable number of columns. A row of memory cells for one embodiment may correspond to memory cells coupled along a select or word line, such as word line 233 of FIG. 2 for example. A column of memory cells for one embodiment may correspond to memory cells coupled along a bit line. For one embodiment where memory cells have circuitry to store complementary signals representative of a bit value, a column of such memory cells for one embodiment may be coupled along complementary bit lines, such as columns 226 and 227 of FIG. 2 for example.

Access Control Circuitry

Access control circuitry 230 may include any suitable circuitry coupled to access memory cells of memory array 220 in any suitable manner. Access control circuitry 230 for one embodiment may access memory cells of memory array 220 in response to requests from logic 202. Logic 202 for one embodiment, as illustrated in FIG. 2, may be part of integrated circuit 200. Logic 202 for another embodiment may be external to integrated circuit 200.

Access control circuitry 230 for one embodiment may be coupled to receive from logic 202, for example, address signals and/or one or more control signals for a memory access operation and may be coupled to receive read data signals from and/or transmit write data signals to logic 202, for example, for the memory access operation. Access control circuitry 230 for one embodiment may receive address signals to identify for a memory access operation one or more target memory cells from which data is to be read and optionally returned for the memory access operation or to which data is to be written for the memory access operation. Access control circuitry 230 for one embodiment may receive one or more control signals for a memory access operation to identify whether data is to be written to or read from memory cells.

Access control circuitry 230 for one embodiment may include any suitable circuitry to select a plurality of memory cells for a memory access operation. Access control circuitry 230 for one embodiment, as illustrated in FIG. 2, may include row decoding circuitry 232 coupled to receive at least a portion of an address from logic 202, for example, and to assert a signal on a corresponding word line to select memory cells in a row of memory cells of memory array 220 in response to the received address or address portion.

Access control circuitry 230 for one embodiment may include any suitable circuitry to select from the selected plurality of memory cells one or more target memory cells for a memory access operation, excluding one or more other selected memory cells. Access control circuitry 230 for one embodiment, as illustrated in FIG. 2, may include column control circuitry 234 and input/output (I/O) circuitry 236. Column control circuitry 234 may be coupled to receive at least a portion of the address from logic 202, for example, and to assert one or more signals on one or more column select lines to control I/O circuitry 236 to select one or more columns of memory cells of memory array 220 in response to the received address or address portion. I/O circuitry 236 may include any suitable circuitry coupled to select any suitable number of one or more columns from among any suitable number of columns of memory array 220 in any suitable manner in response to one or more signals from column control circuitry 234. A memory cell in both a row selected by row decoding circuitry 232 and a selected column for one embodiment may be a target memory cell for a memory access operation.

For one example with reference to FIG. 2, row decoding circuitry 232 may assert a signal on word line 233 to select for a memory access operation memory cells in a row including memory cells 221 and 223. Column control circuitry 234 may assert one or more signals to control I/O circuitry 236 to select for the memory access operation one or more columns, such as column 227 but not column 226 for example. Selected memory cell 223 may therefore be a target memory cell for the memory access operation, and selected memory cell 221 may not be a target memory cell for the memory access operation.

I/O circuitry 236 may include any suitable circuitry coupled to read from one or more target memory cells a bit value for inclusion in at least a portion of read data for a memory access operation and/or to write to one or more target memory cells a bit value from at least a portion of write data for a memory access operation.

Selecting memory cells for a memory access operation for one embodiment may result in one or more memory cells losing a bit value. For one embodiment where memory cells along a word line are implemented, for example, as memory cell 1 of FIG. 1 with reduced concern for cell stability, assertion of a signal on the word line to select such memory cells might potentially result in one or more such memory cells losing a bit value.

Access control circuitry 230 for one embodiment may include circuitry, such as loss detection circuitry 241 and 242 for example, coupled to detect whether one or more selected memory cells lose a bit value. I/O circuitry 236 for one embodiment may include sense and write back circuitry, such as sense and write back circuitry 246 and 247 for example, coupled to sense and write back a bit value in one or more selected memory cells detected to have lost a bit value to restore the bit value in such memory cell(s). Such sense and write back circuitry for one embodiment may be coupled to sense on one or more bit lines one or more signals representative of a bit value from a selected memory cell and to assert on such bit line(s) one or more signals representative of the bit value to the memory cell.

Such sense and write back circuitry for one embodiment may also be used to sense a bit value from one or more target memory cells for a memory access operation. Such sense and write back circuitry for one embodiment may be coupled to sense on one or more bit lines one or more signals representative of a bit value from a target memory cell for a memory access operation and to output one or more signals representative of the bit value for at least a portion of read data for the memory access operation. Such sense and write back circuitry for one embodiment may be implemented to write back a bit value to a memory cell when activated to sense the bit value from the memory cell. Such sense and write back circuitry for one embodiment may therefore write back a bit value to one or more target memory cells regardless of whether such target memory cell(s) are detected to have lost a bit value. Such sense and write back circuitry for one embodiment may therefore sense and write back a bit value in some selected memory cells for the memory access operation but not sense and write back a bit value in one or more other selected memory cells.

I/O circuitry 236 for one embodiment may include sense and write back circuitry corresponding to individual columns of memory cells. As illustrated in FIG. 2 for one embodiment, sense and write back circuitry 246 may correspond to column 226 and sense and write back circuitry 247 may correspond to column 227. I/O circuitry 236 for one embodiment may help select one or more columns and therefore one or more target memory cells for a memory access operation by selectively activating sense and write circuitry for one or more columns in response to one or more signals from column control circuitry 234.

For one example with reference to FIG. 2, memory cells 221 and 223 may be selected by assertion of a signal on word line 233 for a memory access operation. Selected memory cell 223 may be a target memory cell for the memory access operation, and selected memory cell 221 may not be a target memory cell for the memory access operation. Sense and write back circuitry 247 for one embodiment may be activated to sense a bit value from target memory cell 223 for the memory access operation and write back the bit value to target memory cell 223. Loss detection circuitry 241 may detect whether selected memory cell 221 loses a bit value as a result of being selected. If memory cell 221 is detected to have lost a bit value, sense and write back circuitry 246 may be activated to sense and write back the bit value in memory cell 221 to restore the bit value. If memory cell 221 is not detected to have lost a bit value, sense and write back circuitry 246 may remain deactivated for the memory access operation.

I/O circuitry 236 for one embodiment may also include precharge circuitry coupled to precharge bit lines coupled to memory cells in columns. I/O circuitry 236 for one embodiment may also include, as illustrated in FIG. 2, any suitable number of any suitable multiplexer(s), such as a multiplexer 249 for example, to selectively output one or more bit values read from one or more target memory cells for inclusion in at least a portion of read data for a memory access operation. Such multiplexer(s) for one embodiment may be used to help select one or more columns and therefore one or more target memory cells for a memory access operation in response to one or more signals from column control circuitry 234. I/O circuitry 236 for one embodiment may also include one or more write drivers to write a bit value to one or more target memory cells for a memory access operation. I/O circuitry 236 for one embodiment may include one or more write drivers coupled to receive from logic 202, for example, one or more signals representative of a bit value from write data for a memory access operation and to assert one or more corresponding signals on one or more bit lines to a target memory cell.

Example Loss Detection Circuitry

Access control circuitry 230 may include any suitable loss detection circuitry to detect whether one or more memory cells lose a bit value in response to a memory access operation. Access control circuitry 230 for one embodiment may include any suitable loss detection circuitry to detect during a memory access operation whether one or more memory cells lose a bit value during the memory access operation.

One or more memory cells for one embodiment may include circuitry that influences an analog signal at a supply node for the memory cell when the memory cell loses a bit value. Access control circuitry 230 for one embodiment may include any suitable loss detection circuitry to sense an analog signal at the supply node of a memory cell and detect whether the memory cell loses a bit value based at least in part on the sensed analog signal. Such circuitry for one embodiment may sense current flowing through the supply node. Such circuitry for one embodiment may sense a voltage at the supply node. Such circuitry for one embodiment may compare a sensed analog signal to a reference and detect whether the memory cell loses a bit value based at least in part on the comparison. Such circuitry for one embodiment may assert a restore signal if such circuitry detects a memory cell losing a bit value.

For one embodiment, memory cells in a column may share a supply node to supply power to such memory cells. Access control circuitry 230 for one embodiment may include loss detection circuitry corresponding to individual columns. As illustrated in FIG. 2 for one embodiment, loss detection circuitry 241 may correspond to column 226 and loss detection circuitry 242 may correspond to column 227. Loss detection circuitry for a column for one embodiment may be coupled to sense an analog signal at a supply node for memory cells of the column. When a memory cell of the column is selected for a memory access operation, loss detection circuitry for the column may detect whether that memory cell loses a bit value based at least in part on the sensed analog signal.

Figure 3:
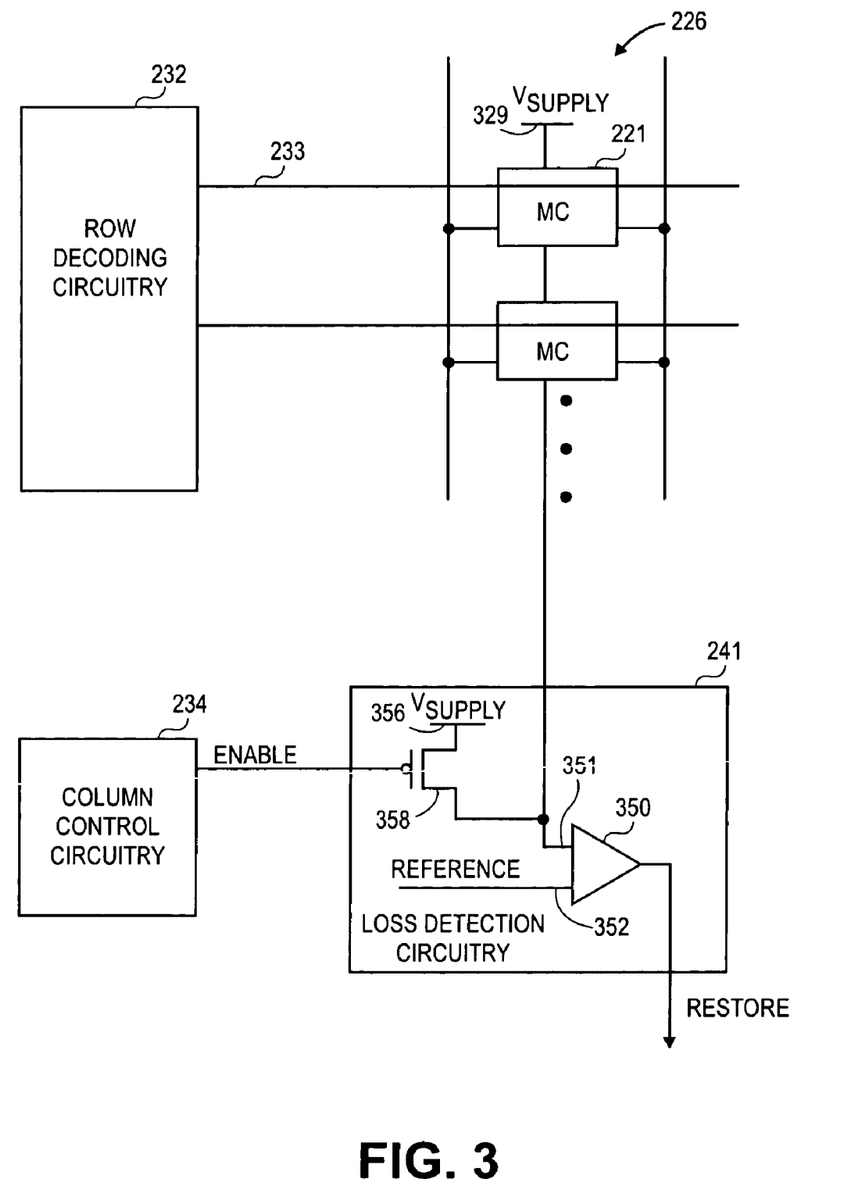
FIG. 3 illustrates, for one embodiment, example circuitry for loss detection circuitry of FIG. 2.

FIG. 3 illustrates, for one embodiment, example circuitry for loss detection circuitry 241 including a sense amplifier 350 having a first input 351 coupled to sense an analog signal at a supply node 329 for column 226 of memory cells and having a second input 352 coupled to receive a reference signal. Sense amplifier 350 for one embodiment may compare a sensed analog signal to a reference corresponding to the reference signal to detect whether a selected memory cell of column 226 loses a bit value and to assert a restore signal if the selected memory cell is detected to have lost a bit value based on the comparison.

A memory cell for one embodiment may include circuitry to store complementary signals representative of a bit value, such as the circuitry of memory cell 1 of FIG. 1 for example, and switch or flip the stored complementary signals when the memory cell loses a bit value to create an extra current inflow through supply node 329 and/or a voltage droop at supply node 329. Sense amplifier 350 for one embodiment may include any suitable circuitry to compare a current flowing through supply node 329 to a reference to detect extra current inflow and therefore detect the memory cell losing a bit value. Sense amplifier 350 for one embodiment may include any suitable circuitry to compare a voltage at supply node 329 to a reference to detect a voltage droop and therefore detect the memory cell losing a bit value.

Access control circuitry 230 for one embodiment may include any suitable circuitry to selectively enable or activate loss detection circuitry to detect a selected memory cell losing a bit value. Loss detection circuitry for one embodiment may be enabled in response to assertion of an enable signal by column control circuitry 234, for example. Column control circuitry 234 for one embodiment may enable loss detection circuitry for a memory access operation. Column control circuitry 234 for one embodiment may enable loss detection circuitry corresponding to selected memory cells, including target and non-target memory cells, for a memory access operation using, for example, a global enable signal. Column control circuitry 234 for one embodiment may enable loss detection circuitry selectively for individual selected memory cells for a memory access operation.

For one embodiment as illustrated in FIG. 3, a pull-up transistor 358 may be coupled to couple first input 351 of sense amplifier 350 to a supply node 356 when activated in response to deassertion of an enable signal by column control circuitry 234, for example, to help prevent sense amplifier 350 from sensing an analog signal at supply node 329. Pull-up transistor 358 may then decouple first input 351 from supply node 356 when deactivated in response to assertion of the enable signal by column control circuitry 234, for example, to allow sense amplifier 350 to sense an analog signal at supply node 329.

Although described in connection with pull-up transistor 358, loss detection circuitry 241 for one embodiment may include any other suitable circuitry to selectively enable sense amplifier 350.

Access control circuitry 230 for another embodiment may include any suitable circuitry to implement a differential current sensing technique to detect switching of stored complementary signals when a selected memory cell in a corresponding column loses a bit value.

Example Sense and Write Back Circuitry

I/O circuitry 236 for one embodiment may include any suitable sense and write back circuitry to sense and write back a bit value in one or more selected memory cells.

Figure 4:
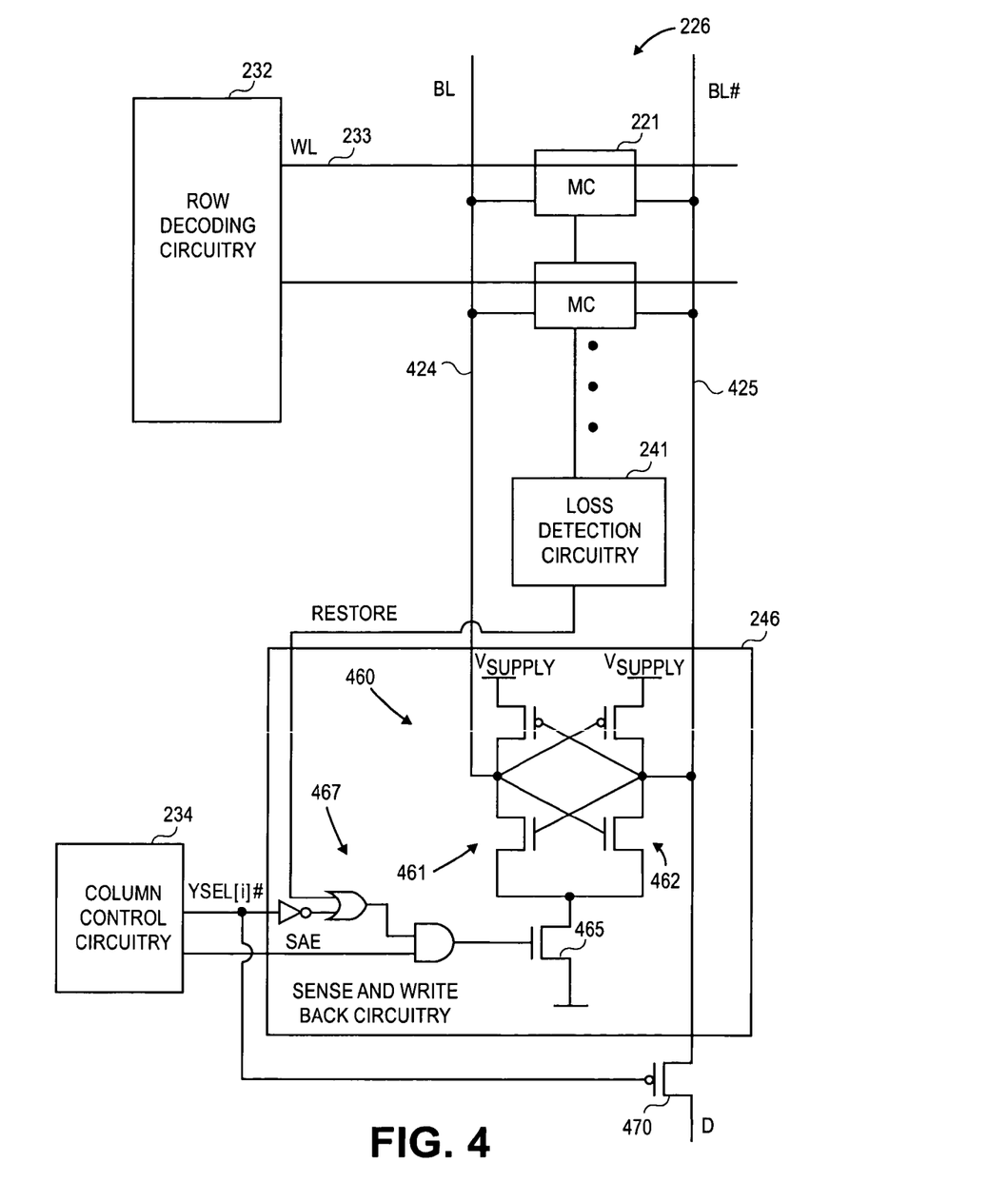
FIG. 4 illustrates, for one embodiment, example circuitry for sense and write back circuitry of FIG. 2.

FIG. 4 illustrates, for one embodiment, example circuitry for sense and write back circuitry 246 including a sense amplifier 460. Sense amplifier 460 may include any suitable circuitry. Sense amplifier 460 for one embodiment, as illustrated in FIG. 4, may have two cross-coupled inverters 461 and 462 coupled between a first supply node and a second supply node, such as a ground node for example, and coupled to sense on bit lines 424 and 425 complementary bit line signals BL/BL# representative of a bit value stored by a selected memory cell in column 226, such as memory cell 221 for example. Memory cell 221 for one embodiment may be selected for a memory access operation in response to assertion of a corresponding signal WL on word line 233 by row decoding circuitry 232 to read complementary signals MC/MC# stored by memory cell 221 onto bit lines 424 and 425 as complementary bit line signals BL/BL#. Cross-coupled inverters 461 and 462 may then store signals BL/BL# and write back signals BL/BL# to memory cell 221 while memory cell 221 remains selected.

I/O circuitry 236 for one embodiment may include any suitable circuitry to selectively enable or activate sense and write back circuitry to restore a bit value in a selected memory cell in response to detection of the selected memory cell losing a bit value and/or to sense in the selected memory cell a bit value for inclusion in at least a portion of read data for a memory access operation. I/O circuitry 236 for one embodiment may include any suitable circuitry to enable sense and write back circuitry in response to a restore signal from corresponding loss detection circuitry. I/O circuitry 236 for one embodiment may include any suitable circuitry to enable sense and write back circuitry in response to a corresponding column select signal from column control circuitry 234.

For one embodiment as illustrated in FIG. 4, an enable transistor 465 may be coupled between cross-coupled inverters 461 and 462 and the second supply node, for example, to enable or sense amplifier 460 when enable transistor 465 is activated. Sense and write back circuitry 246 for one embodiment may include any suitable circuitry to implement logic 467 coupled to activate enable transistor 465 in response to assertion of a restore signal from corresponding loss detection circuitry 241 or in response to assertion of a corresponding column select signal, such as a corresponding active low column select signal YSEL[i]# for example, from column control circuitry 234. Sense and write back circuitry 246 for one embodiment, as illustrated in FIG. 4, may implement logic 467 to allow sense amplifier 460 to be enabled in response to assertion by column control circuitry 234 of a global sense amplifier enable signal SAE for a memory access operation.

Figure 5:
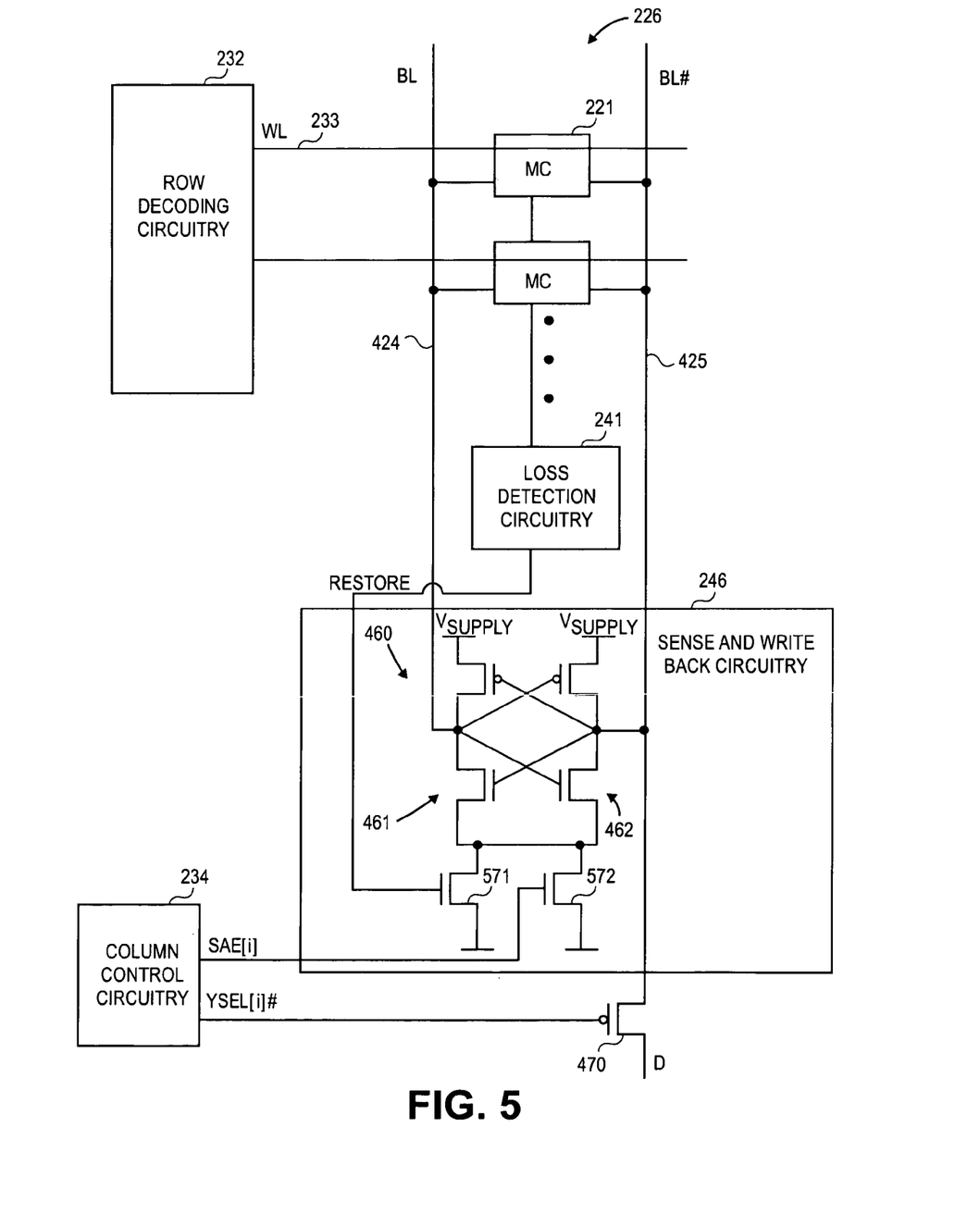
FIG. 5 illustrates, for one embodiment, example circuitry for sense and write back circuitry of FIG. 2.

For one embodiment as illustrated in FIG. 5, enable transistors 571 and 572 may be coupled in parallel between cross-coupled inverters 461 and 462 and the second supply node, for example, to enable sense amplifier 460 when transistor 571 and/or transistor 572 are activated. Enable transistor 571 for one embodiment may be coupled to be activated in response to assertion of a restore signal from corresponding loss detection circuitry 241. Enable transistor 572 for one embodiment may be coupled to be activated in response to assertion of a corresponding column sense amplifier enable signal SAE[i] from column control circuitry 234.

Although described in connection with circuitry illustrated in FIGS. 4 and 5, sense and write back circuitry 246 for one embodiment may include any other suitable circuitry to selectively enable sense amplifier 460.

I/O circuitry 236 for one embodiment may include any suitable circuitry to output one or more signals representative of a bit value sensed from a selected memory cell for inclusion in at least a portion of read data for a memory access operation. For one embodiment as illustrated in FIGS. 4 and 5, a multiplexer transistor 470 may be coupled between a storage node defined by cross-coupled inverters 461 and 462 and a data signal line and may be coupled to be activated in response to assertion by column control circuitry 234 of a corresponding column select signal, such as a corresponding active low column select signal YSEL[i]# for example, to output at least one of the sensed signals, such as bit line signal BL# for example, as a data signal D to logic 202, for example.

Figure 6:
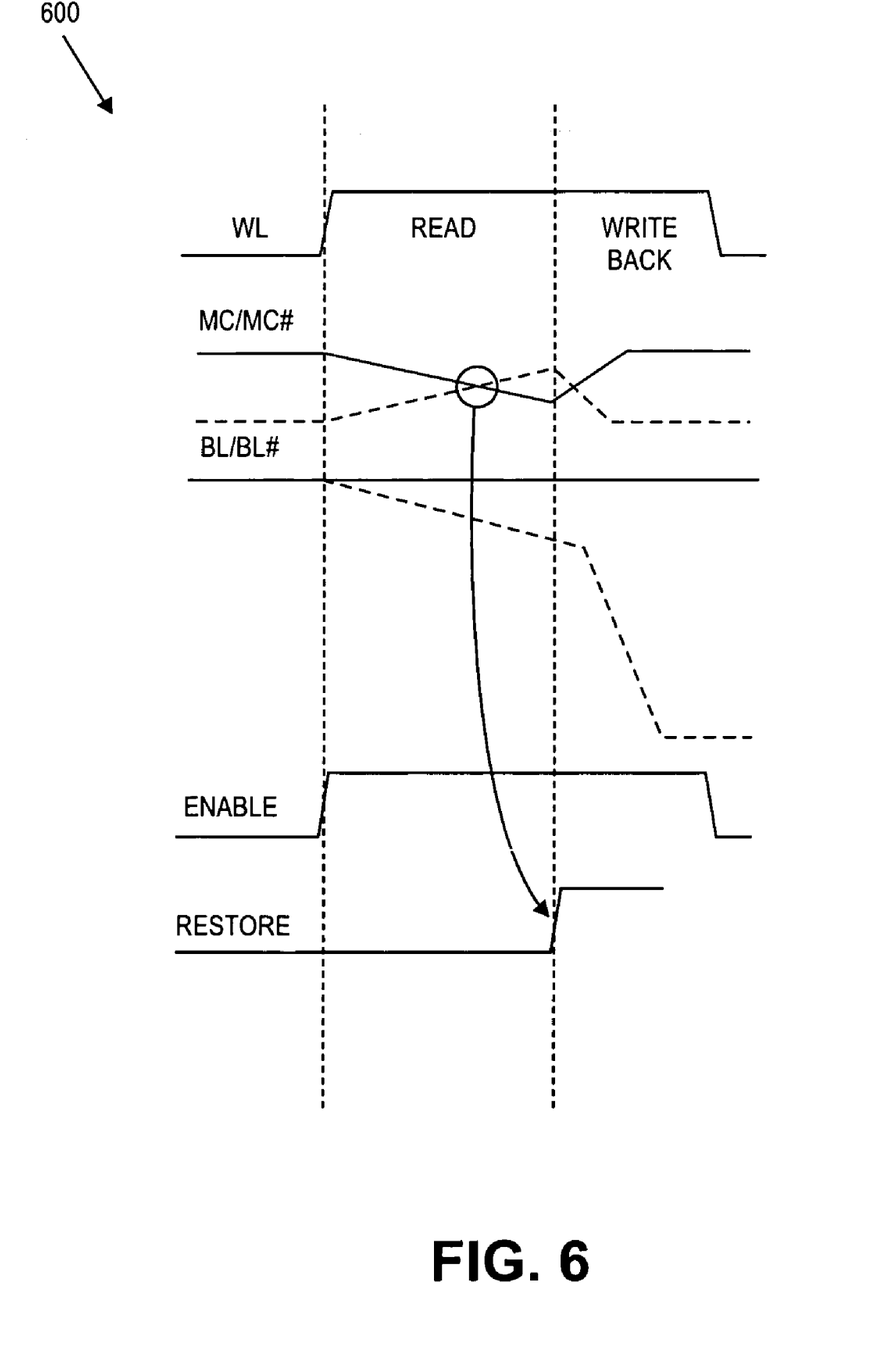
FIG. 6 illustrates, for one embodiment, an example timing diagram for circuitry of FIG. 2.

FIG. 6 illustrates, for one embodiment, an example timing diagram 600 to detect loss of and restore a bit value in memory cell 221. As illustrated in FIG. 6, memory cell 221 may be selected by assertion of a word line signal WL for a memory access operation to read complementary signals MC/MC# stored by memory cell 221 onto precharged bit lines 424 and 425, causing one of the bit line signals BL or BL# to discharge based on the bit value represented by complementary signals MC/MC# stored by memory cell 221 and causing memory cell 221 to potentially lose its stored bit value. For this example, memory cell 221 is not a target of the memory access operation. Loss detection circuitry 241 may also be enabled for the memory access operation by assertion of an ENABLE signal. Loss detection circuitry 241 may detect flipping of the complementary signals MC/MC# stored by memory cell 221 and therefore detect memory cell 221 losing its stored bit value. In response to detecting that memory cell 221 loses its stored bit value, loss detection circuitry 241 may assert a RESTORE signal to enable sense and write back circuitry 246. Sense and write back circuitry 246 may then sense bit line signals BL/BL# and write the sensed bit line signals BL/BL# back to memory cell 221 while it remains selected by word line signal WL to restore the bit value in memory cell 221.

Example Operation

Figure 7:
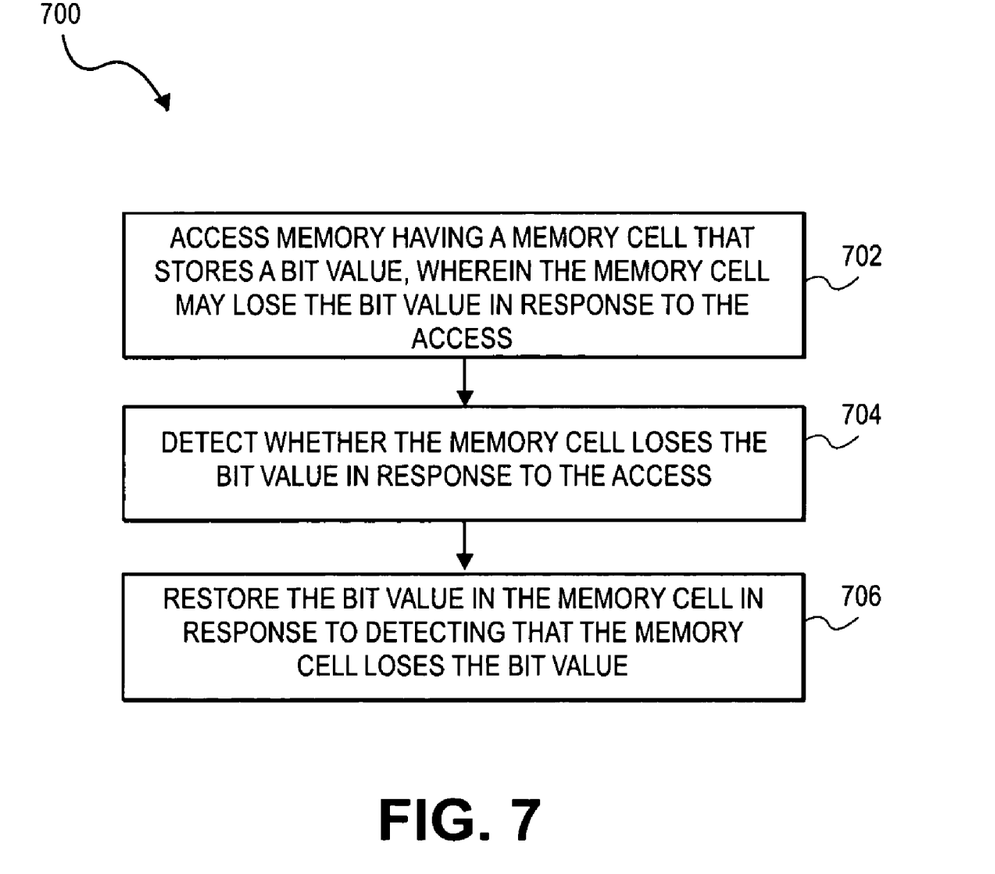
FIG. 7 illustrates, for one embodiment, an example flow diagram for circuitry of FIG. 2.

FIG. 7 illustrates, for one embodiment, a flow diagram 700 to detect loss of and restore a bit value in a memory cell.

For block 702 of FIG. 7, memory having a memory cell that stores a bit value may be accessed, wherein the memory cell may lose the bit value in response to the access. The memory cell for one embodiment may not be a target of the access. For one embodiment, a plurality of memory cells may be selected for the access, and a bit value in some selected memory cells may be sensed and written back.

For block 704, whether the memory cell loses the bit value in response to the access may be detected. For one embodiment, an analog signal at a supply node for the memory cell may be sensed to detect whether the memory cell loses the bit value. The sensed analog signal for one embodiment may be compared to a reference. For one embodiment, current flowing through the supply node may be sensed. For one embodiment, a voltage at the supply node may be sensed.

For block 706, the bit value may be restored in the memory cell in response to detecting that the memory cell loses the bit value. For one embodiment, the bit value may be sensed and written back to the memory cell.

Example System

Figure 8:
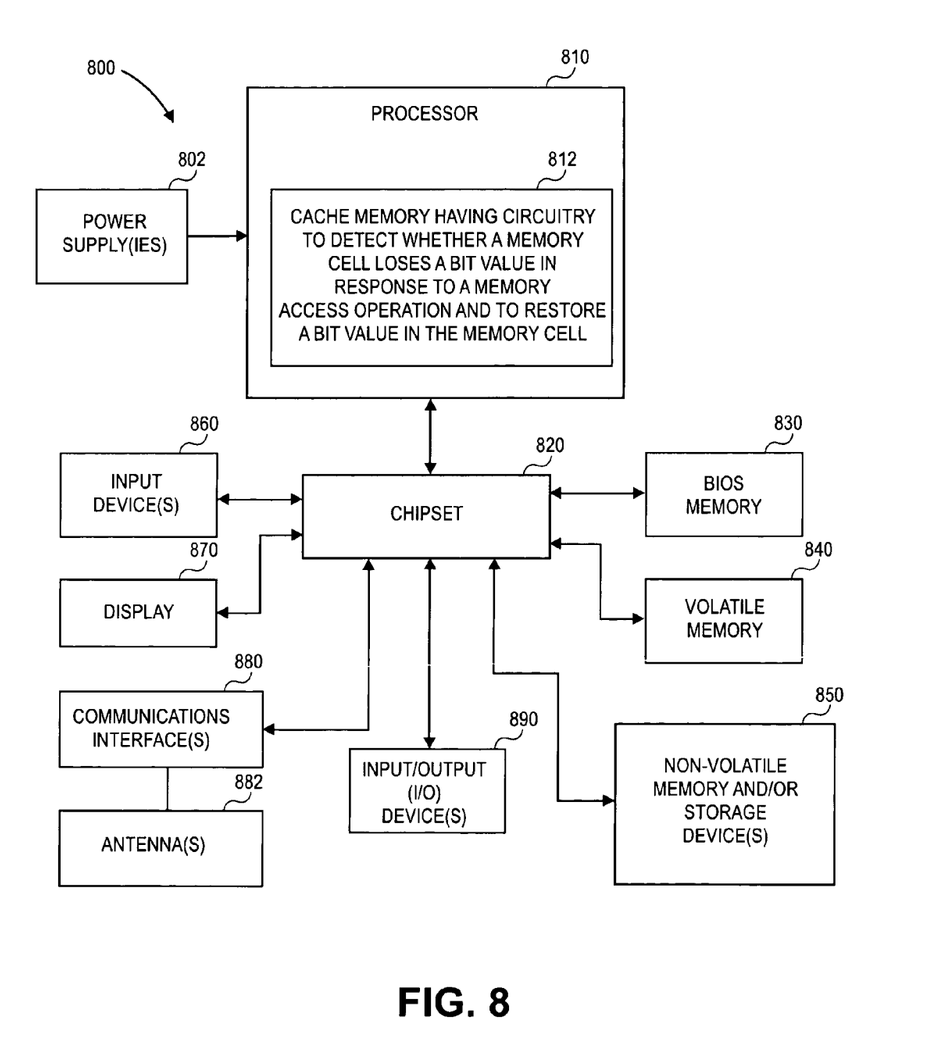
FIG. 8 illustrates, for one embodiment, a block diagram of an example system comprising a processor having cache memory having circuitry to detect whether a memory cell loses a bit value in response to a memory access operation and to restore a bit value in the memory cell.

Integrated circuit 200 with memory 210 of FIG. 2 may be used in any suitable system. Integrated circuit 200 with memory 210 for one embodiment may respectively correspond to an integrated circuit having cache memory 812 for a processor 810 used in a system 800 as illustrated in FIG. 8. Cache memory 812 has circuitry to detect whether a memory cell loses a bit value in response to a memory access operation and to restore a bit value in the memory cell. Integrated circuit 200 for one embodiment may also correspond to an integrated circuit with cache memory separate from processor 810. System 800 for another embodiment may include multiple processors one or more of which may have an integrated circuit having cache memory 812 having circuitry to detect whether a memory cell loses a bit value in response to a memory access operation and to restore a bit value in the memory cell.

Processor 810 for one embodiment may be coupled to receive power from one or more power supplies 802. Power supply(ies) 802 for one embodiment may include one or more energy cells, such as a battery and/or a fuel cell for example. Power supply(ies) 802 for one embodiment may include an alternating current to direct current (AC-DC) converter. Power supply(ies) 802 for one embodiment may include a DC-DC converter. Power supply(ies) 802 for one embodiment may include one or more voltage regulators to help supply power to processor 810.

System 800 for one embodiment may also include a chipset 820 coupled to processor 810, a basic input/output system (BIOS) memory 830 coupled to chipset 820, volatile memory 840 coupled to chipset 820, non-volatile memory and/or storage device(s) 850 coupled to chipset 820, one or more input devices 860 coupled to chipset 820, a display 870 coupled to chipset 820, one or more communications interfaces 880 coupled to chipset 820, and/or one or more other input/output (I/O) devices 890 coupled to chipset 820.

Chipset 820 for one embodiment may include any suitable interface controllers to provide for any suitable communications link to processor 810 and/or to any suitable device or component in communication with chipset 820.

Chipset 820 for one embodiment may include a firmware controller to provide an interface to BIOS memory 830. BIOS memory 830 may be used to store any suitable system and/or video BIOS software for system 800. BIOS memory 830 may include any suitable non-volatile memory, such as a suitable flash memory for example. BIOS memory 830 for one embodiment may alternatively be included in chipset 820.

Chipset 820 for one embodiment may include one or more memory controllers to provide an interface to volatile memory 840. Volatile memory 840 may be used to load and store data and/or instructions, for example, for system 800. Volatile memory 840 may include any suitable volatile memory, such as suitable dynamic random access memory (DRAM) for example. Processor 810 for one embodiment may use cache memory 812 to store data and/or instructions stored or to be stored in volatile memory 840, for example, for faster access to such data and/or instructions.

Chipset 820 for one embodiment may include a graphics controller to provide an interface to display 870. Display 870 may include any suitable display, such as a cathode ray tube (CRT) or a liquid crystal display (LCD) for example. The graphics controller for one embodiment may alternatively be external to chipset 820.

Chipset 820 for one embodiment may include one or more input/output (I/O) controllers to provide an interface to non-volatile memory and/or storage device(s) 850, input device(s) 860, communications interface(s) 880, and/or I/O devices 890.

Non-volatile memory and/or storage device(s) 850 may be used to store data and/or instructions, for example. Non-volatile memory and/or storage device(s) 850 may include any suitable non-volatile memory, such as flash memory for example, and/or may include any suitable non-volatile storage device(s), such as one or more hard disk drives (HDDs), one or more compact disc (CD) drives, and/or one or more digital versatile disc (DVD) drives for example.

Input device(s) 860 may include any suitable input device(s), such as a keyboard, a mouse, and/or any other suitable cursor control device.

Communications interface(s) 880 may provide an interface for system 800 to communicate over one or more networks and/or with any other suitable device. Communications interface(s) 880 may include any suitable hardware and/or firmware. Communications interface(s) 880 for one embodiment may include, for example, a network adapter, a wireless network adapter, a telephone modem, and/or a wireless modem. For wireless communications, communications interface(s) 880 for one embodiment may use one or more antennas 882.

I/O device(s) 890 may include any suitable I/O device(s) such as, for example, an audio device to help convert sound into corresponding digital signals and/or to help convert digital signals into corresponding sound, a camera, a camcorder, a printer, and/or a scanner.

Although described as residing in chipset 820, one or more controllers of chipset 820 may be integrated with processor 810, allowing processor 810 to communicate with one or more devices or components directly. As one example, one or more memory controllers for one embodiment may be integrated with processor 810, allowing processor 810 to communicate with volatile memory 840 directly.

In the foregoing description, example embodiments have been described. Various modifications and changes may be made to such embodiments without departing from the scope of the appended claims. The description and drawings are, accordingly, to be regarded in an illustrative rather than a restrictive sense.

What is claimed is:

1. An apparatus comprising:
    a memory cell to store a bit value, wherein the memory cell may lose the bit value in response to a memory access operation;
    first circuitry to detect whether the memory cell loses the bit value in response to the memory access operation, wherein the first circuitry is to sense an analog signal at a supply node for the memory cell to detect whether the memory cell loses the bit value; and
    second circuitry to restore the bit value in the memory cell in response to detection that the memory cell loses the bit value, wherein the second circuitry is to restore the bit value by sensing the bit value and writing the bit value back to the memory cell.

2. The apparatus of claim 1, wherein the first circuitry is to compare the sensed analog signal to a reference and detect that the memory cell loses the bit value if the sensed analog signal exceeds the reference.

3. The apparatus of claim 1, wherein the first circuitry is to sense current flowing through the supply node.

4. The apparatus of claim 1, wherein the first circuitry is to sense a voltage at the supply node.

5. The apparatus of claim 1, wherein the memory cell is one of a plurality of memory cells and is separate from any memory cell that is a target of the memory access operation.

6. The apparatus of claim 1, wherein the memory cell is one of a plurality of memory cells and wherein the apparatus comprises:
    circuitry to select the plurality of memory cells for the memory access operation; and
    circuitry to sense and write back a bit value in some selected memory cells for the memory access operation.

7. The apparatus of claim 1, wherein the memory cell is a static random access memory (SRAM) cell.

8. The apparatus of claim 1, wherein the memory cell is one of a plurality of memory cells;
    wherein the apparatus comprises circuitry to select a row of memory cells including the one memory cell in response to the memory access operation;
    wherein the supply node is for a column of memory cells including the one memory cell; and
    wherein the first circuitry is to sense the analog signal at the supply node for the column of memory cells to detect whether the one memory cell loses the bit value.

9. A method comprising:
    accessing memory having a memory cell that stores a bit value, wherein the memory cell may lose the bit value in response to the accessing;
    detecting whether the memory cell loses the bit value in response to the accessing, wherein the detecting includes sensing an analog signal at a supply node for the memory cell to detect whether the memory cell loses the bit value; and
    restoring the bit value in the memory cell in response to detecting that the memory cell loses the bit value, wherein the restoring includes sensing the bit value and writing the bit value back to the memory cell.

10. The method claim 9, wherein the detecting includes comparing the sensed analog signal to a reference and detecting that the memory cell loses the bit value if the sensed analog signal exceeds the reference.

11. The method of claim 9, wherein the sensing includes sensing current flowing through the supply node.

12. The method of claim 9, wherein the sensing includes sensing a voltage at the supply node.

13. The method of claim 9, wherein the memory cell is one of a plurality of memory cells of the memory and is separate from any memory cell that is a target of the accessing.

14. The method of claim 9, wherein the memory cell is one of a plurality of memory cells and wherein the accessing includes;
    selecting the plurality of memory cells; and
    sensing and writing back a bit value in some selected memory cells.

15. The method of claim 9, wherein the memory cell is one of a plurality of memory cells of the memory;
    wherein the accessing includes selecting a row of memory cells including the one memory cell;
    wherein the supply node is for a column of memory cells including the one memory cell; and wherein the detecting includes sensing the analog signal at the supply node for the column of memory cells to detect whether the one memory cell loses the bit value.

16. A system comprising:

volatile memory; and a processor having cache memory including:

a memory cell to store a bit value, wherein the memory cell may lose the bit value in response to a memory access operation,     first circuitry to detect whether the memory cell loses the bit value in response to the memory access operation, wherein the first circuitry is to sense an analog signal at a supply node for the memory cell to detect whether the memory cell loses the bit value, and     second circuitry to restore the bit value in the memory cell in response to detection that the memory cell loses the bit value, wherein the second circuitry is to restore the bit value by sensing the bit value and writing the bit value back to the memory cell.

17. The system of claim 16, wherein the memory cell is one of a plurality of memory cells of the cache memory and wherein the cache memory includes:

circuitry to select the plurality of memory cells for the memory access operation, and     circuitry to sense and write back a bit value in some selected memory cells for the memory access operation.

18. The system of claim 16, wherein the first circuitry is to compare the sensed analog signal to a reference and detect that the memory cell loses the bit value if the sensed analog signal exceeds the reference.

19. The system of claim 16, wherein the memory cell is one of a plurality of memory cells of the cache memory and is separate from any memory cell that is a target of the memory access operation.

20. The system of claim 16, wherein the memory cell is one of a plurality of memory cells of the cache memory;

wherein the cache memory includes circuitry to select a row of memory cells including the one memory cell in response to the memory access operation;

wherein the supply node is for a column of memory cells including the one memory cell; and     wherein the first circuitry is to sense the analog signal at the supply node for the column of memory cells to detect whether the one memory cell loses the bit value.

\* \* \* \* \*